United States Patent [19]

Stewart

[11] 4,337,522
[45] Jun. 29, 1982

[54] MEMORY CIRCUIT WITH MEANS FOR COMPENSATING FOR INVERSION OF STORED DATA

[75] Inventor: Roger G. Stewart, Neshanic Station, N.J.

[73] Assignee: RCA Corporation, New York, N.Y.

[21] Appl. No.: 145,324

[22] Filed: Apr. 29, 1980

[51] Int. Cl.³ .............................................. G11C 7/00
[52] U.S. Cl. ................................... 365/190; 365/228
[58] Field of Search ................ 365/184, 185, 95, 228, 365/229, 154, 155, 190, 189

[56] References Cited

U.S. PATENT DOCUMENTS 3,922,647  11/1975  Broeker, Jr. ......................... 365/189
4,095,281   6/1978  Denes .............................. 365/184 X Primary Examiner—Bernard Konick
Assistant Examiner—Donald McElheny, Jr.
Attorney, Agent, or Firm—Samuel Cohen; Henry I. Schanzer

[57] ABSTRACT

Information stored in a reference cell is inverted when the information stored in a memory cell is inverted. The memory cell information is derived from a first Exclusive OR gate receptive of an input data signal and the reference cell output signal. Information is read out of the memory cell via a second Exclusive-OR gate receptive of the output of the memory cell and the output of the reference cell. Regardless of any inversion within the memory cell, the signal produced at the output of the second Exclusive OR gate is of the same binary significance as the input data applied to the first Exclusive-OR gate.

10 Claims, 3 Drawing Figures

MEMORY CIRCUIT WITH MEANS FOR COMPENSATING FOR INVERSION OF STORED DATA

BACKGROUND OF THE INVENTION

This invention relates to circuitry which compensates for certain inversions of the information stored within a memory cell, where the inversions occur after the information is written into the cell and before the information is read-out of the cells.

Inversion of the data being stored in the storage cells of a memory array may occur for many different reasons. For example, in dynamic memory systems the data stored in the cells has to be periodically refreshed. To reduce the number of components in the refreshing circuitry a simple inverter, instead of a non-inverting amplifier, may be used. As a result each time the contents of the array are refreshed they are also inverted, (i.e. a "0" is rewritten as a "1" and vice-versa a "1" as a "0".)

Another example of an instance where the contents of a memory cell may be inverted is set forth in my copending application titled, "RANDOM ACCESS MEMORY WITH VOLATILE AND NON-VOLATILE STORAGE" bearing Ser. No. 144,922 and assigned to the same assignee as this application, and the subject matter of which is incorporated herein by reference.

The referenced application discloses a memory cell (see for example cell 10 in FIG. 2 of this application) having a volatile storage section (e.g. 11) and a non-volatile storage section (e.g. 12). Information of first binary significance stored in the volatile section may be transferred to the non-volatile section. Subsequently, the information stored in the non-volatile section may be recalled and transferred back into the volatile section. However, the information transferred back to the volatile section causes the latter to store information of second binary significance. The contents of the volatile section therefore undergo an inversion.

SUMMARY OF THE INVENTION

The problem of the inversion of the contents of the memory cell is resolved in circuits embodying the invention by making the inversion transparent to the user. Circuits embodying the invention include a reference cell keyed to the memory cell whereby the contents of the reference cell undergo an inversion when the contents of the memory cell undergo an inversion. Information corresponding to a data input signal present on a data bus is written into a selected memory cell via first gating means responsive to the data input signal and to the output of the reference cell. Information is read-out of a selected memory cell via second gating means responsive to the output signal of the memory cell and to the output of the reference cell. The first and second gating means are of the type which produce an output signal having one binary value when their inputs are of like binary significance and which produce an output signal of the other binary value when their inputs are of different binary significance. The combination of the keyed reference cell and the two gating means ensures that the output of the second gating means is of like binary significance to the data input signal initially present on the data bus.

BRIEF DESCRIPTION OF THE DRAWINGS

In the accompanying drawing like reference characters denote like components.

DETAILED DESCRIPTION OF THE INVENTION

Figure 1:
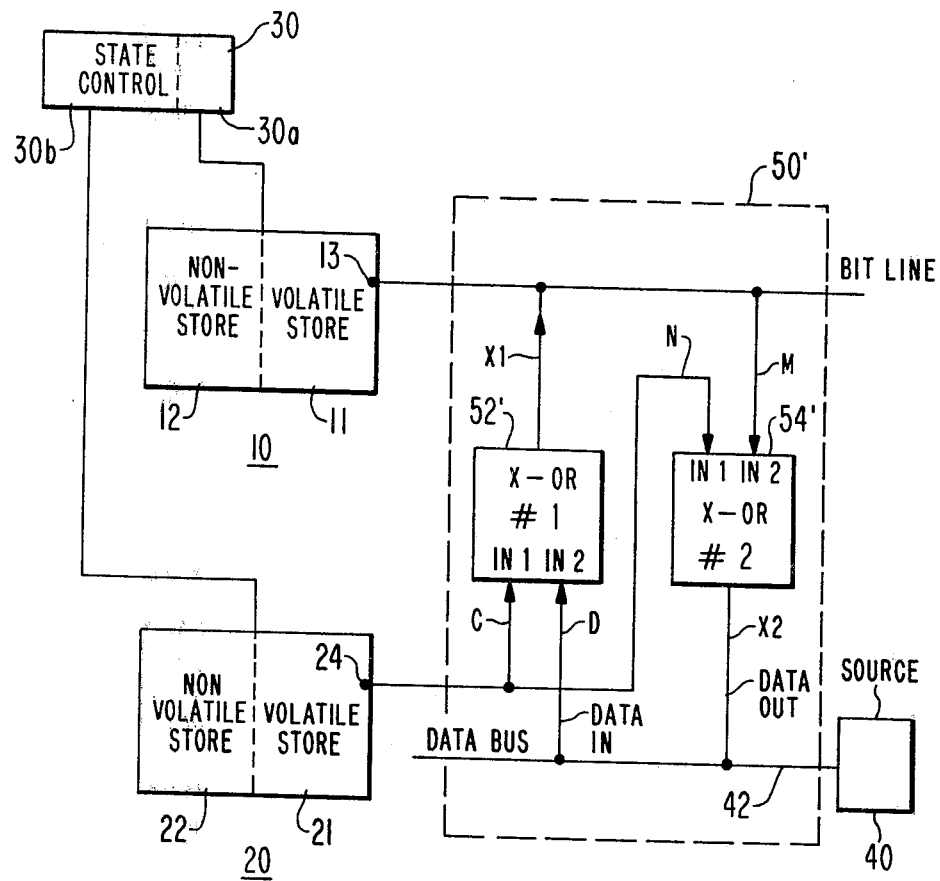
FIG. 1 is a simplified block diagram representation of part of a memory system embodying the invention.

In the discussion to follow, it will be convenient to discuss operation in Boolean terms. The convention arbitrarily adopted is that the more positive voltage ("high") used in the system represent the binary digit "1" and the less positive voltages ("Low") represent the binary digit "0". To further simplify the explanation of the circuit operation, it will sometimes be stated that a "1" or a "0" is applied to a circuit or obtained from a circuit rather than stating that a voltage which is indicative of a "1" or a "0" is applied to or derived from a circuit.

To still further simplify the explanation, it will sometimes be stated that an input or output is high or low rather than stating that the signal at the input terminal or the signal at the output terminal is high or low.

The invention will be first explained with reference to the circuit of FIG. 1 which includes: (1) a memory cell 10 which may be one cell of a memory array of cells; (2) a reference cell 20; (3) decoding and control switching circuitry 30a and 30b for selectively setting the operating modes of cells 10 and 20; (4) a signal source 40 which supplies to bus 42 a data input signal to be stored in memory cell 10 and which derives from bus 42, at some later time, the signal stored in the memory cell; and (5) Write/Read circuit 50' coupled between source 40 and cells 10 and 20 for applying to cell 10 a bit of information corresponding to a data input and for subsequently reading out the contents of cell 10 and producing a data output signal having the same binary significance as the original data input.

Memory cell 10 includes a volatile storage section (VS) 11, a non-volatile storage section (NVS) 12, means for selectively transferring information between sections 11 and 12, and an input-output terminal 13 connected to a bit line. Information applied to the bit line is selectively written into the volatile section 11 of cell 10. The contents of cell 10 can be selectively transferred from VS 10 to NVS 12 for permanent storage. Subsequently, the information can be selectively recalled or ("transferred back") from NVS 12 to VS 10. However, the memory cell is of the type whose contents undergo an inversion when the information is transferred back. Thus, a first binary state (e.g. "0") contained in VS 10 when transferred to NVS 12 causes NVS 12 to assume a first conductive condition (e.g. highly conductive). Subsequently, when the content of NVS 12 is transferred back to VS 10, the first conductive condition of NVS 12 sets VS 10 to the second binary state (e.g. "1"). Likewise, the other binary state (e.g. "1") contained in VS10 when transferred to NVS 12 causes NVS 12 to assume a second conductive condition (e.g. non-conductive). When NVS 12 is in the second conductive condition and its contents are transferred back to VS 10 the latter is set to the first binary condition (e.g. "0").

The inverted information contained in VS 10 is then selectively read-out onto terminal 13 and the bit line.

Reference cell 20 includes a volatile storage section 21 and a non-volatile storage section 22 similar to sections 11 and 12, respectively, of memory cell 10. Cell 20, like cell 10, includes means for selectively transferring information between sections 21 and 22 and, like cell 10, the contents of reference cell 20 undergo an inversion whenever the information in the reference cell is transferred from the volatile section to the non-volatile section and recalled back to the volatile section. Furthermore, cell 20 is "keyed" via control circuit 30 to cell 10. The reference cell is keyed or controlled to ensure that, whenever the contents of the memory cell are transferred from volatile store to non-volatile store and then recalled back to volatile store the reference cell undergoes a like cycle. Cell 20 produces an output signal, 0, at an output terminal 24.

The write portion of Read/Write circuit 50' includes a first two-input Exclusive-OR gating means 52' having one input (designated as the "D" input) connected to Data Bus 42, having its other input (designated as the "C" input) connected to reference cell output 24, and producing at its output a signal designated as X1 coupled to the bit line and terminal 13. The read portion of circuit 50' includes a second two-input Exclusive OR gating means 54' having one input (designated as the "M" input) connected to the bit line (terminal 13) having its other input (designated as the "N" input) coupled to output 24, and producing at its output a signal designated as X2 which is applied, to data bus 42.

Exclusive-OR means 52' and 54' may include any one of a number of known logic gates of the type which produces an output signal (e.g. X1) of one binary value (e.g. "0") when its two inputs have the same binary value (e.g. C=D=0 or C=D=1) and produces the other binary value (e.g. "1") at its output when its two inputs have different binary values (e.g. C=1, D=0; or C=0, D=1). In this circuit, each one of gating means 52' and 54' produces an output which is "low" or "0" when its inputs have the same value (i.e. both are low or both are high) and an output which is "high" or "1" when its inputs are different (i.e. one input is high and the other input is low, or one input is low and the other one is high).

Note also that when the two input signals to a two-input Exclusive-OR gate are simultaneously inverted that its output signal does not change in value.

The write and read operation of the system will now be discussed. Recall that a data input "D" is applied to one input of Exclusive OR gate 52' and that a signal designated as "C" is applied to its other input. The output X1 of gate 52' may be expressed in terms of its input variables (C and D) as follows:

$$X1 = C\overline{D} + \overline{C}D \qquad \text{Eq. 1}$$

X1 is equal to "1" if C≠D, and X1 is equal to "0" if C=D. That is, as detailed in Table 1 below; (a) X1 is equal to a "low" or "0" if D is high="1" and C is "1"; (b) X1 is equal to "1" if D is "1" and C is "0"; (c) X1 is equal to "0" if D is "0" and C is "0"; and (d) X1 is equal to "1" if D is "0" and C is "1".

The X1 output is applied to terminal 13 and is selectively written into memory cell 10. If there is no inversion of the contents of the memory cell between the time the information is written into the cell and the time the information is read out from the cell the output signal read out onto the bit line (which defines the value of the "M" input to gate 54') will have the same binary significance as the X1 signal previously written into the cell; (i.e. M=X1). Furthermore, if there is no inversion of the contents of cell 10 there is likewise no inversion of the reference cell output signal. Then the "N" signal (second input) to gate 54 is equal to the "C" signal previously applied to gate 52, (i.e. N=C). The output X2 of gate 54 may be expressed in terms of its input variables as:

$$X2 = N\overline{M} + \overline{N}M \qquad \text{Eq. 2}$$

since M=X1, and N=C $$X2 = C(\overline{X1}) + \overline{C}(X1) \qquad \text{Eq. 2a}$$

Substituting $C\overline{D} + \overline{C}D$ for the variable X1 and $(\overline{C}+D)(\overline{D}+C)$ for $\overline{X1}$ in equation 2 and then simplifying reveals that:

$$X2 = D \qquad \text{Eq. 3}$$

Thus, X2 is of the same binary significance as the data input on data bus 42 previously applied to gate 52' and clearly the correct data is read-out onto the data bus.

If, following the writing of X1 into memory cell 10, the contents of the cell undergo an inversion, then when the cell is read-out onto the bit line the "M" input to gate 54' will have a value equal to $\overline{X1}$. However, recall that the reference cell is keyed to the memory cell such that when the contents of the memory cell are inverted the contents of the reference cell are likewise inverted. Hence, the N-input to gate 54' will have a value of $\overline{C}$. Referring back to equation 2 and substituting $\overline{C}$ for N and $\overline{X1}$ for M, output X2 may then be expressed as:

$$X2 = \overline{\overline{C}} \cdot \overline{X1} + \overline{C} \cdot \overline{\overline{X1}} \qquad \text{Eq. 4}$$

which reduces to $$X2 = C \cdot \overline{X1} + \overline{C} \cdot X1 \qquad \text{Eq. 5}$$

X2 in equation 5 is identical to X2 in equation 2a and likewise reduces to:

$$X2 = D$$

Therefore, gate 54' again produces an output signal which is of identical binary significance to the data input signal originally present on data bus 42.

Thus, by means of a keyed reference cell whose output is inverted whenever the memory cell output is inverted, the output X2 has the same value as if there were no inversion within the memory cell and the correct value of the data input is restored at the output X2. The possible conditions of data input (D) and reference cell output are listed in TABLE 1. It is evident from an examination of the table that the initial condition of the reference cell output does not affect the correct read-out so long as the reference cell output inverts whenever the memory cell inverts.

It has thus been shown that the information written into memory cell 10 (via gate 52') can either remain as written or be inverted, and that an output signal is produced at the output of gate 54' having the same binary significance as the data input. Of course, this depends on reference cell 20 undergoing a like number of internal transfers as the memory cell. It has also been shown that the reference cell output may be, initially, at either binary state and that a correct output will be produced so long as the reference cell changes state each time the corresponding memory cell changes state.

applying a "stress" potential across its source-to-drain path in excess of a given voltage, which in this application is assumed to be 12 volts. In the conductive state $P_S$ functions essentially as a resistive element. Once set

TABLE I

| Data Input | Reference Cell Output Terminal 24 | $X = \overline{CD} + \overline{C}\overline{D}$ $C = O_{24}$ | Assuming no Inversion; i.e. X1 written into Memory Cell 10 is subsequently read out onto bit line unchanged $N = C; X1 = M;$ | | | Assuming Inversion of Cell Contents, i.e. X1 written into Memory Cell 10 subsequently read out onto bit line as $\overline{X1}$; $O_{24}$ also inverted $M = \overline{X1}; N = \overline{C}$ | | |
|---|---|---|---|---|---|---|---|---|
| "D" | $O_{24}$ | X1 | $C = N \quad M = X1$ | $X2 = N\overline{M} + \overline{N}M$ | | $N = \overline{C} \quad M = X1$ | $X2 = N\overline{M} + \overline{N}M$ | |
| | | | | $X2 = C . \overline{X1} + \overline{C}X1$ | | | $X2 = C . \overline{XL} + \overline{C} . \overline{X1}$ | |
| | | | | $X2 = D$ | | | $X2 = C \overline{X1} + \overline{C} . XL$ $= D$ | |
| 1 | 1 | 0 | 1 | 0 | 1 | 0 | 1 | 1 |
| 1 | 0 | 1 | 0 | 1 | 1 | 1 | 0 | 1 |
| 0 | 1 | 1 | 1 | 1 | 0 | 0 | 0 | 0 |
| 0 | 0 | 0 | 0 | 0 | 0 | 1 | 1 | 0 |

Figure 2:
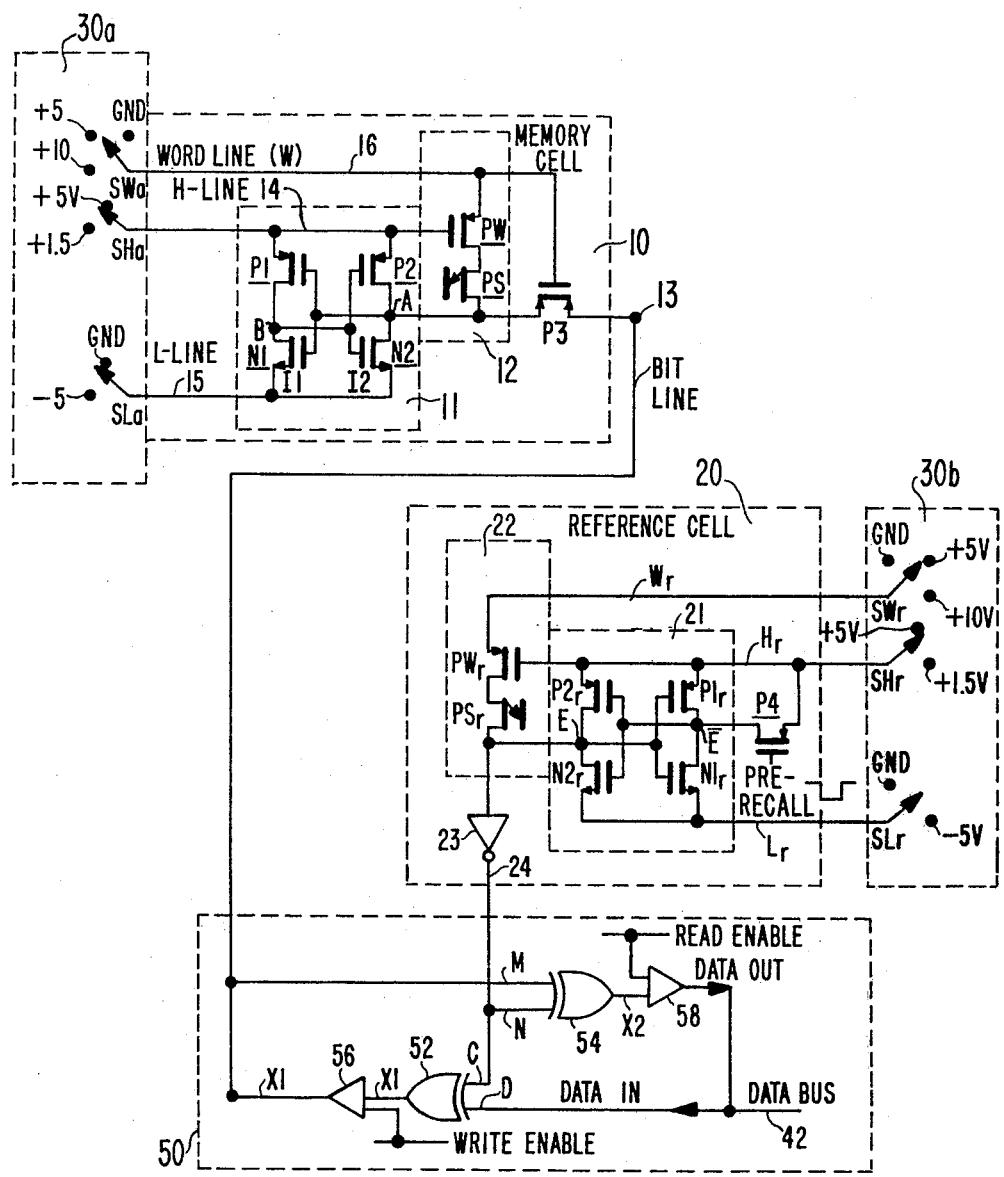
FIG. 2 is a diagram partially in schematic and partially block form of circuitry embodying the invention.

The circuit of FIG. 1 may be implemented as shown in FIG. 2. Detailed schematic diagrams of cells 10 and 20 are shown and the read/write may take the logic form shown for circuitry 50.

Memory cell 10 includes a volatile storage section (VS) 11, a non-volatile storage section (NVS) 12, and a pass transistor P3 whose conduction path is connected between a node A, which is one of the internal input-/output nodes of the cell, and cell input-output terminal 13 to which is connected a bit line (BL).

Section 11 is a flip-flop comprised of two cross-coupled complementary inverters I1 and I2. Inverter I1 includes transistors P1 and N1 and inverter I2 includes transistors P2 and N2. The sources of transistors P1 and P2 are connected to an H-line 14 and the sources of transistors N1 and N2 are connected to an L-line 15. The drains of transistors P2 and N2 are connected to each other and to the gates of P1 and N1 at node A which defines the Q output of the flip-flop. In a similar nammer the drains of transistors P1 and N1 are connected to each other and to the gates of transistors P2 and N2 at node B which defines the $\overline{Q}$ output of the flip-flop. Information is written into flip-flop 11 by turning on P3 and coupling the information on the bit line (terminal 13) to the flip-flop. A "high" (e.g. +5 volts) on the bit line is coupled via the conduction path of P3 to node A causing A to be latched "high" and the output at node B to be latched "low". A "low" (e.g. 0 volts) on the bit line is coupled to node A via P3 causing node B to be latched "high" and node A to be regeneratively clamped to zero volts.

Information is read-out of cell 10 by turning on P3 and coupling the level at node A onto the bit line.

Section 12 includes a non-volatile floating gate field effect transistor (FET), $P_S$, functioning as a non-volatile storage element or memory device and a word line switching transistor $P_W$. $P_W$ is connected at its source to a word line 16 and at its gate electrode to H-line 14. The conduction paths (source-to-drain paths) of $P_W$ and $P_S$ are connected in series between word line 16 and node A. $P_S$ may be formed, by way of example, as taught in my copending application titled NON-VOLATILE MEMORY DEVICE filed Oct. 11, 1978 bearing Ser. No. 948,507 and also assigned to the assignee of the present application. The structure and operation of the floating gate FET, $P_S$, is known in the art and need not be greatly detailed. Suffice it to say that, $P_S$ has a "conductive" state and a "non-conductive" state. $P_S$ is set from the non-conductive to the conductive state by to the conductive state, $P_S$ remains in the state even after the stress potential is removed, (i.e. $P_S$ is a non-volatile storage element).

Once in the conductive state $P_S$ may be reset ("erased") to the non-conductive state by applying ultraviolet light onto the transistor or by applying relatively large voltages (e.g. 100 volts) to a gate electrode (not shown) overlying (and isolated from) the floating gate and the substrate region of $P_S$. In the non-conductive state, $P_S$ exhibits a very high source-to-drain impedance and it is assumed that no current flows in its source-drain path. Once rendered non-conductive, $P_S$ remains non-conductive until its source-drain path is stressed by a voltage equal to or greater than 12 volts.

Gating or "pass" transistor P3 has its conduction channel connected between node A and the bit line and its gate electrode connected to word line 16. When P3 is turned on, node A is closely coupled to the bit line. When P3 is turned off sections 11 and 12 may be considered to be electrically disconnected from the bit line.

Control circuit 30a includes a switch SWa connected to word line 16 for selectively applying to it either +10 volts, +5 volts or ground; a switch SHa connected to line 14 for selectively applying to it either +5 volts or +1.5 volts; and a switch SLa connected to line 15 for selectively applying to it either ground or −5 volts.

The information in VS section 11 may be transferred to NVS section 12 by setting switches SW, SH and SL to apply +10 volts to word line 16, +5 volts to line 14, and −5 volts to line 15. This condition turns on transistor $P_W$ in series with $P_S$ and turns off P3. With $P_W$ turned-on the contents of section 11 can be written into section 12. With line 15 at −5 volts, a "high" at node A is still +5 volts, while a "low" at node A is then −5 volts. Assuming $P_S$ to have been reset to the non-conducting state, line 16 to be at 10 volts, and line 14 at +5 volts, the "low" of −5 volts at A causes $P_S$ to be rendered conductive while the "high" of +5 volts causes $P_S$ to remain in the non-conductive state.

Subsequently, the information in NVS section 12 can be transferred back ("RECALLED") into VS section 11 by first setting flip flop 11 so that Q is low and then setting switches SW, SH and SL to apply +10 volts to word line 16, +1.5 volts to line 14 and 0 volts to line 15. $P_W$ is then turned-on and P3 is turned off. With $P_S$ in the conductive state, node A is driven "high", while with $P_S$ in the non-conductive state node A remains low.

After the transfer, switches SW and SH are set to apply +5 volts to lines 16 and 14. Node A then goes to +5 volts if $P_S$ was in the conductive state and remains at zero if $P_S$ was in the non-conductive state.

Reference cell 20 includes a volatile section (VS) 21 which is schematically identical to volatile section 11, and a non-volatile section (NVS) 22 which is identical to section 12 and need not be detailed. The source of the transfer control transistor PWr in section 22 is connected to a line Wr. The gate of PWr and the sources of flip-flop transistors P1r and P2r are connected to the line Hr and the sources of flip-flop transistors N1r and N2r are connected to a line Lr.

The reference cell has an internal output point E which is connected to the input of an isolating buffer inverter 23 whose output 24 is connected to one of the two inputs of Exclusive-OR gates 52 and 54 in circuit 50.

The reference cell also includes a resetting transistor P4 having its conduction path connected between H-line 14 and a node $\overline{E}$ to which are connected the drains of P1r and N1r and the gates of P2r and N2r, and having a gate electrode to which is applied a preRecall pulse.

Control circuit 30b, whose switches are ganged (not shown) with those of circuit 30a for concurrent operation of transfers within memory cell 10 and reference cell 20, includes a switch SWr connected to line Wr for applying to it either ground (GND), +5 volts or +10 volts; a switch SHr connected to line Hr for applying to it either +5 volts or +1.5 volts; and a switch SLr connected to line Lr for applying to it either ground or −5 volts.

The write portion of READ-WRITE circuit 50 includes a first two-input Exclusive OR gate 52 having one input designated as "D" connected to Data Bus 42, its other input designated as "C" connected to reference cell output 24, and having an output designated as X1 connected to one input of a two input gate 56. The other input of gate 56 is connected to a write enable terminal. When the write enable signal is in the enabling mode the output of gate 56 is logically identical to X1 and is, for ease of discussion, also designated as X1. The output of gate 56 is connected to the bit line connected to terminal 13. The read portion of circuit 50 includes a second two-input Exclusive-OR gate 54 having one input designated as "M" connected to terminal 13, and its other input designated as "N" connected to output 24. The output of gate 54 designated as X2 is applied to one input of two input gate 58, the other input to gate 58 is a read enable signal. When the latter is in the enable mode the signal at the output of gate 58 which, is logically identical to the value of X2, is applied to bus 42. Gates 56 and 58 when enabled function as non-inverting buffers and when disabled produce a high impedance floating output.

A data input on bus 42 is applied to the "D" input of gate 52 whose output X1 will be "1" or "0" depending on the value of its second "C" input. X1 is transferred without change in its binary significance via gate 56, when the latter is enabled, onto the bit line and is applied to terminal 13. The value of X1 can then be written into memory cell 10 by turning on P3. A "high" at terminal 13 causes node A to go "high" and a "low" at terminal 13 causes A to go "low". During WRITE, P3 is turned-on (and $P_W$ is turned-off) by applying 0 volts to line 16 and the flip-flop is powered by applying +5 volts to line 14, and ground to line 15. Concurrently, during WRITE, line Wr is held at either +5 volts or ground, line Hr is held at +5 volts whereby transistor PWr is turned off, and line Lr is held at ground. Consequently, during WRITE reference cell 20 remains in whatever stable state it was in prior to the writing of new information into cell 10. Hence, the reference cell output at terminal 24 maintains a value equal to the signal "C" applied to gate 52 used by the latter to generate the X1 signal being written into cell 10.

The information stored in cell 10 can be selectively read out by turning on P3 and coupling node A onto the bit line. If A is "high" the bit line goes "high" and if A is "low" the bit line goes "low". Assuming no inversion within cell 10, its contents (A=X1) are read out onto the bit line and the signal (X1) applied to the bit line is of identical binary significance to the X1 signal previously written into cell 10. With no inversion in cell 10, the reference cell output remains as it was when X1 was generated. Consequently, the N input to gate 54 is of like significance to the C input previously applied to gate 52 and the M input to gate 54 is of like binary significance to the X1 output of gate 52.

For these conditions the output of gate 54 is always of like binary significance to the data input (D) applied to gate 52 as discussed above and as set forth in TABLE 1.

Assume now that the information in VS section 11 is transferred to NVS section 12. However, when that occurs a transfer of information also occurs between VS section 21 and NVS section 22 of the reference cell. During transfer, +10 volts are applied to lines 16 and Wr via switches SWa and SWr, respectively; +5 volts are applied to lines 14 and Hr via switches SHa and SHb, respectively; and −5 volts are applied to lines 15 and Lr via switches SLa and SLb, respectively. Transistors PW and PWr are turned on and the voltage across the VS sections of cells 10 and 20 is increased to 10 volts (+5 and −5) to enable the contents of section 11 to be transferred to section 12 and the contents of section 21 to be transferred to section 22. Under these transfer conditions a "high" at node A causes $P_S$ to remain "non-conductive" while a "low" at node A causes $P_S$ to become "conductive". Similarly, a "high" at node E causes $P_{Sr}$ to remain "non-conductive" while a "low" at node E causes $P_{Sr}$ to become "conductive".

The information stored in the non-volatile storage section may be selectively recalled (transferred back) to the volatile section.

Prior to recalling the information from NVS section 12 to VS section 11, the volatile section 11 is set so that node A is set low. This may be accomplished by applying a zero to the bit line and writing that into the cell, or by the use of other reset means (not shown).

In a similar manner, a prerecall pulse is applied to transistor P4 to turn it on and cause node E to go low. Following the setting of nodes A and E to the low level the following conditions are generated to effectuate the transfer of information back from the non-volatile section to the volatile section. +10 volts are applied to lines 16 and Wr; +1.5 volts are applied to lines 14 and Hr, and 0 volt is applied to lines 15 and Lr. If $P_S$ is conductive, node A will be driven high while if $P_S$ is non-conductive node A remains low. Similarly if $P_{Sr}$ is conductive node E is driven high while if $P_{Sr}$ is non-conductive node E remains low.

Following this step, +5 volts are applied to lines 16 and Wr and to lines 14 and Hr. This turns off the PW transistors and essentially decouples the non-volatile sections from the volatile sections. Sections 11 and 21 then latch up to the signal condition transferred back into the cell. The volatile sections then assume a state which is the inverse of the state present in the volatile section when their contents are written into the non-volatile sections.

However, note that the reference cell as well as the memory cell has undergone an inversion. When there is an inversion of the data in the memory cell and a concurrent inversion of the data in the reference cell, the read/write circuitry 50 produces an output X2 of like binary significance to the data input, "D".

Since the output of the memory cell is the inverse of the information (X1) written into the memory cell, the signal M applied to gate 54 is equal to $\overline{X1}$. Similarly, since the output of the reference cell is the inverse of the signal applied to gate 52 to general X1, the signal N applied to gate 54 is equal to $\overline{C}$.

The value of the two inputs $M = \overline{X1}$ and $N = \overline{C}$ to gate 54 are now the inverse of what they were (M=X1 and N=C) prior to the inversions in the memory and reference cells.

It can readily be shown that the output of an Exclusive OR gates does not change if its two inputs are inverted. Hence, the output of gate 54 is the same as for the case when the reference cell output and the memory cell outputs were not inverted. Hence, once again the output of gate 54 and the output of gate 58 are in phase with the data input signal originally present on the data bus.

Exclusive OR gates 52 and 54 may be replaced by any known logic gating means that can perform the described function. In the circuits of FIGS. 1 and 2, Exclusive OR gates have been used, for ease of description. It should be evident that Exclusive NOR gates could be used instead with like results.

Similarly, gates 56 and 58 could be replaced with other tri-state drivers or other known logic gates performing like functions with like results to those described.

The reference cell 20 shown in the FIGURES is very similar in structure and function to the memory cell 10. This has some significant advantages in that the reference cell operates in a similar manner to the memory cell and tracks changes affecting the memory cell. However, it should be evident that the reference cell could be replaced by any means capable of assuming either one of two stable states and which would also be coupled to the memory cell in such a way as to be responsive to the transfer of information and the recall of that information within the memory cell so as to produce an output which would undergo an inversion (go from one state to the other) each time there is a recall of information following a transfer of information within the memory cell.

Figure 3:
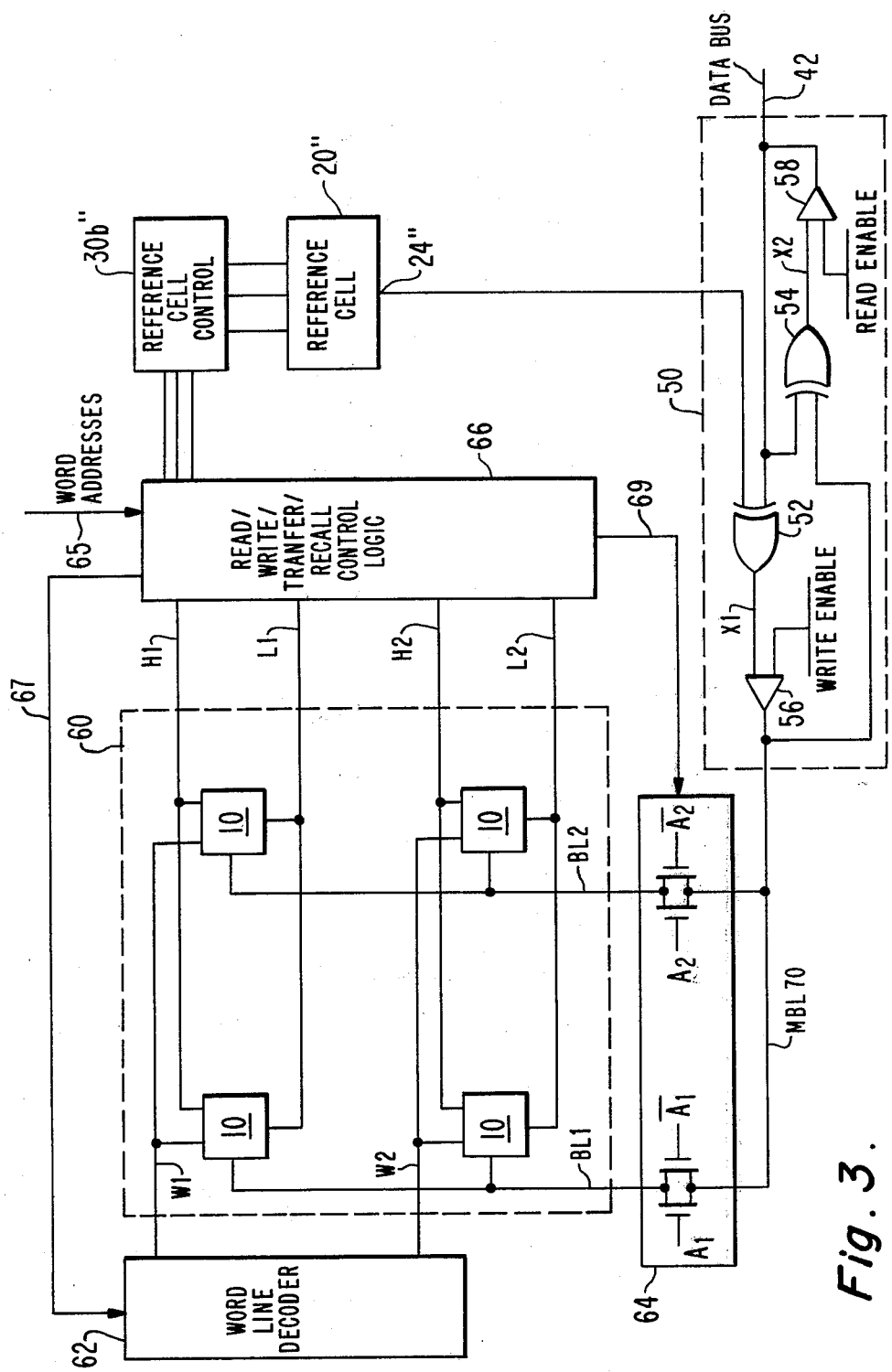
FIG. 3 is a block diagram of a memory system embodying the invention.

The circuit of the invention is suitable for use in conjunction with a memory system as shown in FIG. 3. The system includes an array 60 of cells 10 arranged in rows (words) and columns (bits). For ease of description, only 2 rows and 2 columns are shown. There is one word line (W1, W2) per row, one bit line (BL1, BL2) per column, and one high (H) line (H1, H2) and one low (L) line (L1, L2) per row.

The H lines are for distributing the more positive (+5 volts, or +1.5 volts) operating potential to the cells of the row, and the L lines (L1, L2) are for distributing the more negative (ground or −5 volts) operating potential to the cells of that row. The word lines are connected to the outputs of a word line decoder 62, the bit lines are connected to the outputs of a bit line decoder 64, the H and L lines are connected to the outputs of READ/-WRITE/TRANSFER/RECALL control logic network 66. The control logic network 66 which is responsive to inputs from a word address bus 65 provides a control signal via a line 67 connected to decoder 62 for selecting a particular word line or lines for read, write, or transfer.

Network 66 also supplies signals via a conductor 69 to decoder 64 for selecting the particular bit line or lines to be coupled to a master bit line 70.

The memory system includes a reference cell 20″ whose operation is controlled by a reference cell control circuit 30b″ coupled to network 66. Input information present on a data bus 42 is written via read/write circuit 50 onto MBL line 70 and then the data on MBL 70 is coupled via decoder 64 to a particular bit line. In a similar vein information read out onto a particular bit line is coupled via decoder 64 to MBL 70. The information on MBL 70 is then read-out via circuit 50 in a manner similar to that described above for FIGS. 1 and 2.

In the operation of the system the data input is again applied to one input of an Exclusive OR gate 52 whose other input is connected to the output 24″ of cell 20″ and whose output X1 is applied via a write enable gate 56 to MBL 70. Then by selecting a bit and a word line the information (X1) on the selected bit line is written into the volatile portion of the cell, corresponding to the selected word and bit lines. Information may thus be selectively and successively written into each of the cells of array 60. The system of FIG. 3 is organized to enable information to be written into one memory cell at a time (i.e. the array is bit organized). However, the system of FIG. 3 can be modified to write information concurrently onto all the bit lines and then transferring the information concurrently into all the cells of a selected word.

As discussed above, the information written into the volatile portion of the cells of the array can subsequently be transferred into their non-volatile portions. In the system of FIG. 3 the contents of the volatile sections of all the memory cells may be transferred to the non-volatile sections at one time. That is, there may be a "block" transfer of information from the volatile sections to the non-volatile sections.

This transfer occurs by setting all the L lines to −5 volts, all the H lines to +5 volts and all the word lines to +10 volts. The +10 volts on the word lines ensure that the "gating" transistor of each memory cell is turned off and isolates the bit lines from the memory cells. The +10 volts on the word lines and the −5 volts on the L lines, as discussed above, also enable the easy transfer of information from the volatile section to the non-volatile section of each cell.

Concurrently, with the transfer of information within the cells of array 60 there is a transfer within the reference cell. The transfer of information within the reference cell is achieved by means of control circuit 30b″ which applies to lines Wr, Hr and Lr of the reference cell voltages corresponding to those applied to the cells of the array, as discussed for FIG. 2.

The recall (transfer back) of information from the non-volatile section all the cells to their volatile section is accomplished by first resetting all the cells of the array so that their A outputs are low.

Block recall of information from the non-volatile section of each cell to its volatile section is accomplished by setting all the word lines, including line Wr, to +10 volts, all the H lines including line Hr to 1.5 volts, and all the L lines including Lr to 0 volts. As described for FIG. 2, the transfer back of the information causes the contents of the volatile sections to be inverted. Similarly, since the reference cell also undergoes a transfer and a recall, its contents after the recall are the inverse of what they were prior to transfer.

Following the "block" recall of information into all the cells of the array and into the reference cell the H lines are brought back to +5 volts and the word lines are brought back to +5 volts (or less if the H line is selected by the decoder).

The information in the cells may then be read out bit by bit onto the master bit line. The information on the master bit line is then applied to one input of Exclusive OR gate 54 to whose other input is applied the output from output 24" of the reference cell. Clearly, each signal produced as the output of gate 54 will have the same binary value at the corresponding data input initially present on the data bus. The circuit of the invention thus corrects for any internal inversion and restores the data-output from the system to the original value of the data-input applied to the system.

The read/write circuit has been illustrated using two-input Exclusive-OR gates 52 and 54, but it should be clear that the circuit of the invention could also use Exclusive-OR type gates having multiplie (more than two) inputs where the output of the multiple input gates is the parity function of its inputs. The output of the gate or parity function being equal to the least significant bit of the binary sum of all the gate inputs.

What is claimed is:

1. The combination comprising:
    a memory cell having an input-output terminal and having a volatile section and a non-volatile section including means for transferring information between the volatile and non-volatile section and wherein the contents of said memory cell undergo an inversion when information transferred from said volatile section to said non-volatile section is recalled from said non-volatile section into said volatile section;
    a reference cell having an output point, said reference cell being keyed to said memory cell whereby the contents of said reference cell undergo an inversion whenever the contents of said memory cell undergo an inversion;
    a data bus adapted to receive an input data signal;
    first, and second gate means, each gate means having two inputs and an output and each being responsive to the signals at its two inputs for producing a signal of first binary significance when its two inputs are of like binary value and for producing a signal of second binary significance when its two inputs are of different binary value;
    means coupling the inputs of said first gate means to the output of said reference cell and to said data bus and its output to the input-output point of said memory cell; and
    means coupling the inputs of said second gating means to the output of said reference cell and to the input-output terminal of said memory cell for producing at the output of said second gating means a signal having the same binary significance as said input data signal.

2. The combination as claimed in claim 1, wherein said first gate means includes a first logic gate having two inputs and an output and a first control gate having two inputs and an output, one input of said control gate being connected to the output of said first logic gate and the other input of said control gate being connected to a control signal for selectively enabling the transfer of the output of said first logic gate to said input-output point of said memory cell; and
    wherein said means coupling the inputs of said first gate means includes means connecting one input of said first logic gate to said data bus and means connecting the other input of said first logic gate to said output point of said reference cell.

3. The combination as claimed in claim 2 wherein said second gate means includes a second logic gate having two inputs and an output and a second control gate having two inputs and an output, one input of said second control gate being connected to the output of said logic gate and the other input of said control gate being connected to a control signal or selectively enabling the transfer of the output of said second logic gate to a data-output point; and
    wherein said means coupling the outputs of said second gate means includes means coupling one input of said second logic gate to said input-out point of said memory cell and means connecting the other input of said second logic gate to said output point of said reference cell.

4. The combination as claimed in claim 1 wherein said means for transferring information between the volatile and non-volatile sections of said memory cell and reference cell include means for transferring the contents within said memory cell and for causing a like transfer within said reference cell.

5. The combination as claimed in claim 4 wherein said means for transferring information between the volatile and non-volatile sections of said cells includes means for transferring information from the non-volatile section to the volatile section, and means for recalling information from the non-volatile section to the volatile section.

6. The combination as claimed in claim 1 wherein said volatile section of said memory cell has an internal input-output node; and
    wherein said memory cell includes a controllable gating transistor having a conduction path and a control electrode, wherein the conduction path of said gating transistor is connected between said internal input-output node and said input-output terminal for enabling writing of new information into the memory cell from said input-output point and the reading-out of the contents of the memory cell onto said input-output point.

7. In combination with a memory cell having a volatile section and non-volatile section including means for transferring information between the volatile and non-volatile section and wherein the contents of said memory cell undergo an inversion when information transferred from said volatile section to said non-volatile section is recalled from said non-volatile section into said volatile section; a circuit for writing information into the memory cell corresponding to a data input signal on a data bus and for subsequently reading the information stored in the memory cell and producing a data output signal of like significance to said data input comprising:
    a reference cell having an output, and also of the type whose contents can be inverted;
    means coupled to said memory cell and to said reference cell for inverting the information stored in the reference cell when the information stored in said memory cell undergoes said given inversion;

first means responsive to said data input signal ("D") on said data bus and to the signal ("C") at said output of said reference cell for producing a first output signal having one binary value when "D" and "C" have the same binary values and the other binary value when "C" and "D" have different binary values;

means for selectively writing said output of said first means into said memory cell for storage in said memory cell; and second means for reading out the contents of the memory cell and for producing a second output, of like binary significance to the value of said data input signal; said second means having one input "M" responsive to the output of said memory cell and another input "N" responsive to the output of said reference and said second means being of the type which produces an output having one binary value when M and N have like binary values and an output having the other binary value when "M" and "N" have different binary values, whereby the input of said second means is of like binary significance to said input signal D.

8. In combination:

a memory cell having an input-output terminal and having a volatile section and a non-volatile section including means for transferring information between the volatile and non-volatile section and wherein the contents of said memory cell undergo an inversion when information transferred from said volatile section to said non-volatile section is recalled from said non-volatile section into said volatile section;

a reference cell having an output terminal, and also of the type whose contents can be inverted;

means coupled to said memory cell and to said reference cell for inverting the information stored in the reference cell whenever the information stored in said memory cell is inverted; and first and second gates, each one of said gates being of the type which produces at its output a signal which is the parity function of its inputs, where the parity function is equal to the least significant bit of the sum of the gate inputs, said first gate receptive of the signal present at the output terminal of said reference cell and an input data signal and applying its output to said input-output terminal of said memory cell for writing into said memory cell, and said second gate receptive of a signal present on said input-output terminal of said memory cell and the signal present at the output terminal of said reference cell, and applying its output to the terminal of said first gate receptive of said data signal.

9. The combination as claimed in claim 8 wherein each one of said first and second gates is a two input gate which produces at its output a signal of first binary significance when its two inputs have the same binary values and a signal of second binary significance when its two inputs have different binary values.

10. The combination as claimed in claim 9 wherein said first and second gates are Exclusive OR gates.

* * * * *